Feb. 3, 1970

A. K. RAPP 3,493,785

BISTABLE CIRCUITS

Filed March 24, 1966

2 Sheets-Sheet 1

INVENTOR.
A. KARL RAPP
BY John V. Regan
Attorney

Feb. 3, 1970 A. K. RAPP 3,493,785

BISTABLE CIRCUITS

Filed March 24, 1966 2 Sheets-Sheet 2

INVENTOR.
A. KARL RAPP
BY John V. Regan
Attorney

United States Patent Office 3,493,785

Patented Feb. 3, 1970

3,493,785
BISTABLE CIRCUITS

Adolph Karl Rapp, Princeton, N.J., assignor to RCA Corporation, a corporation of Delaware Filed Mar. 24, 1966, Ser. No. 537,180
Int. Cl. H03k *3/26*
U.S. Cl. 307—279 9 Claims

ABSTRACT OF THE DISCLOSURE

Two two-state circuits, each comprising a pair of inverters. The output signal of the first inverter of each pair is applied directly to the second inverter of that pair and the output signal of the second inverter is applied through a switch such as a transmission gate, to the first inverter of the same pair. A bit stored in the first circuit is transferred to the second circuit during one time period by means of a switch such as a third transmission gate and during another time period the complement of the bit is fed back from the second circuit to the first circuit by means of a switch such as a fourth transmission gate.

This invention relates to data-handling. More specifically, the present invention relates to digital signal storage and gating elements.

In the field of data-handling, signal storage and gating circuits are widely employed to form logical gates, counters, shift registers, etc. The present trend of manufacturing these devices is toward miniaturization with integrated circuitry having the current maximum utility in this direction. Accordingly, it is desirable to employ signal storage and gating circuits having elements with an adaptability for reproduction by integrated circuit techniques while exhibiting digital signal handling and storage capability for performing data-handling operations.

An object of the present invention is to provide an improved signal storage and gating circuit.

Another object of the present invention is to provide an improved digital counter.

A further object of the present invention is to provide an improved electronic signal storage and gating circui using field-effect transistors.

A still further object of the present invention is to provide an improved field-effect transistor circuit having counting, storing and reset capabilities.

Still another object of the present invention is to provide a signal gating circuit for selectively applying an input signal to an output line.

In accomplishing these and other objects, there has been provided, in accordance with the present invention, a signal storage and gating circuit comprising a first and a second pair of signal inverter stages and a pair of gating means responsive to input signal levels applied thereto. The gating means are arranged to selectively cross-connect a pair of inverter stages in a flip-flop configuration in response to a combination of the input signal levels. A reversal of the input signal levels is effective to transfer the flip-flop state from one inverter pair to the other pair of inverter stages. These transfers of the flip-flop state are effective to provide an output level from the circuit representative of the change in input signal levels.

A better understanding of the present invention may be had when the following description is read in connection with the accompanying drawing in which.

Figure 1:
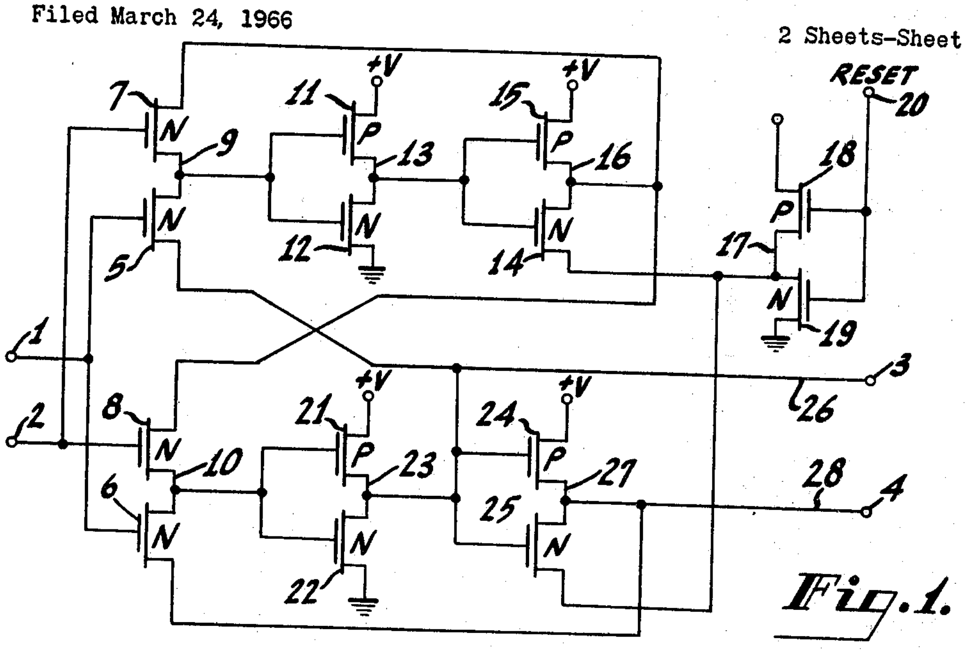
FIGURE 1 is a schematic illustration of a binary counter stage embodying the present invention.

Referring to FIGURE 1, there is shown an example of the present invention as a binary counter stage having a pair of input terminals 1, 2 and a pair of output terminals 3, 4. The counter stage is arranged to be compatible with duplicate counter stages connected in series using interconnected input and output terminals, as necessary. The first input terminal 1 is connected to the gate electrodes of a first and a second N-type field-effect transistor 5, 6, hereinafter referred to as FET's 5 and 6. Similarly, the second input terminal 2 is connected to the gate electrodes of a third and fourth FET 7 and 8. These FET's are used as bilaterally conducting transmission gates. The first and third FET's 5 and 7 are connected in series by means of an electrode interconnection 9 connected to one electrode of each FET. Similarly, the second and fourth FET's 6 and 8 are serially connected by an electrode interconnection 10.

The interconnection 9 is arranged to supply the gate electrodes of a fifth and sixth FET 11, 12. These FET's 11, 12 are a complementary pair serially connected by interconnection 13 to form a signal inverter stage. The source electrode of the sixth FET 12 is connected to ground, while the source electrode of the fifth FET 11 is connected to a source +V. The interconnection 13 is connected to the gate electrodes of a second complementary FET pair 14, 15, arranged as a signal inverter stage, also having the source electrode of FET 15 connected to a source +V. An interconnection 16 of the second pair 14, 15 is connected to a source-drain electrode of the third FET 7 and the fourth FET 8. The source electrode of the N-type FET 14 of the second pair may be connected to an interconnection 17 of a third complementary FET pair 18, 19 comprising a reset means connected between ground and the source +V. The gate electrodes of the third pair 18, 19 are both connected to a reset signal terminal 20. Without the reset means, the source electrodes of FET 14 and 25 would be grounded.

The interconnection 10 is connected to the gate electrodes of a fourth inverter stage having a FET complementary pair 21 and 22. The fourth FET pair is, also, connected between ground and the source +V. An interconnection 23 of the FET pair 21, 22 is connected to the gate electrodes of a fifth FET complementary pair 24, 25, to an output line 26 tied to output terminal 3, and to the remaining electrode of the first FET 5. The fifth FET pair 24, 25 is connected between the source +V and the interconnection 17 of the third FET pair 18, 19. An interconnection 27 of the fifth FET pair 24, 25 is connected to a second output line 28 tied to output terminal 4 and to the remaining electrode of the second FET 6. The FET's may advantageously be of the insulated-gate type, while the polarities of the transistors and supply potentials are shown only for purposes of illustration.

In operation, the binary counter stage shown in FIGURE 1 is arranged to change the signal state, or level, of the output terminals 3, 4 for each two changes of state of the input signal terminals 1, 2; i.e., the frequency of output signal transistors is equal to one-half the frequency of input signal transitions. Assume that input terminal 2 is connected to a high level state designated as "HI" and input terminal 1 is connected to a low level state designated as "LO". These input states may be output signals from either a clock signal source of preceding binary counter stage output lines. Under the aforesaid signal state, the FET's 7 and 8 are turned "on," and the FET's 5 and 6 are turned "off." The interconnection 16 of the second signal inverter FET pair 14, 15 is connected through transistor 7 to the gate electrodes of the first signal inverter FET pair 11, 12. This connection makes a "flip-flop" of the first and second inverter FET pairs. The source electrode of FET 14 is connected to ground through the FET 19 of the third FET pair which is kept in a conducting state by a "HI" level signal on terminal 20.

Assume that this flip-flop is such a state that the interconnection 16 is HI and the interconnection 13 is LO. The HI state of interconnection 16 is, also applied through conducting transistor 8 to the interconnection 10 to be applied to the gate electrodes of the fourth FET pair 21, 22. This HI input to the fourth pair is inverted to a LO output signal on output line 26 and to a HI output signal on output line 28 by the fifth FET pair 24, 25.

A reversal of the input signal states turns off transistors 7, 8 and turns on transistors 5, 6. Conducting transistor 6 connects the HI output line 28 to the gate electrodes of the fourth FET pair 21, 22 to produce a "flip-flop" in combination with the fifth FET pair 24, 25 to store the HI state of line 28. The first and second FET pair is no longer interconnected since transistor 7 is now nonconducting. The conducting state of the first transistor 5 is effective to apply the LO level of line 26 to the gate electrodes of the first FET pair 11, 12. Connection 13 of inverter-pair 11, 12, thus, assumes a HI level and, in turn, forces connection 16 of the second FET pair 14, 15 to assume a LO level. A second reversal of the input signal states is effective to latch the first and second FET pairs back into a flip-flop with the prior LO state on interconnection 16. This is transmitted through transistor 8, the fourth FET pair 21, 22, and the fifth FET pair 24, 25 to the output line 28 to switch the output 4 to LO while the output line 26 and output 3 is in a HI state from the level on interconnection 23 being applied directly thereto. Thus, for a complete cycle of the input levels, the output on line 28 only changes state once. Since the flip-flop latching occurs rapidly each time because the outputs and inputs forming the flip-flops, e.g., interconnections 16 and 9, are at the same potential during latching, no charge redistribution is necessary and signal-race problems are avoided. Reset of the stage is effected by changing the reset level of terminal 20 to LO to raise the sources of the transistors 14 and 25 to the supply +V. This forces interconnection 16 and output line 28 HI. If the input 2 is HI at this time, this input state is retained on output line 28 enabling cascaded binary-counter stages to be simultaneously reset.

It may be appreciated that the circuit of the present invention may, also, be used in a gated manner to provide a readout of the input information on one input line. Thus, one input line can serve as an input source while the other input line is used as a gating control. Thus, the output is not present until the gate input line is energized with a gate level signal. Subsequently, the circuit may be reset in preparation for the next gating operation. A plurality of circuits embodying the present invention may, therefore, be used as a gated input register.

The circuit of the present invention has particular utility in being adaptable for manufacture in integrated circuit form to exploit its advantages while maintaining a minimal structural volume.

Figure 2:
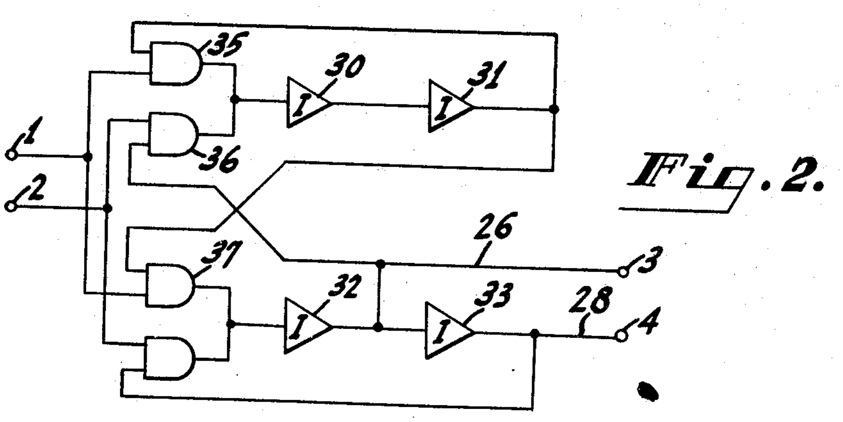
FIGURE 2 is a simplified block diagram of the circuit of FIGURE 1.

In FIGURE 2, there is shown a generalized block diagram of the circuit of FIGURE 1. A first inverter stage 30 comprises transistors 11 and 12 while a second inverter stage 31 comprises transistors 14, 15. Transistors 21, 22 are embodied in a third inverter 32 with transistors 24, 25 in a fourth inverter 33. A first gate means 35 corresponds to gate transistor 7 while a second gate means 36 to transistor 5. Similarly, a third gate means 37 corresponds to transistor 8 while a fourth gate means 38 represents transistor 6. The reset circuit is omitted from this block diagram.

Figure 3:
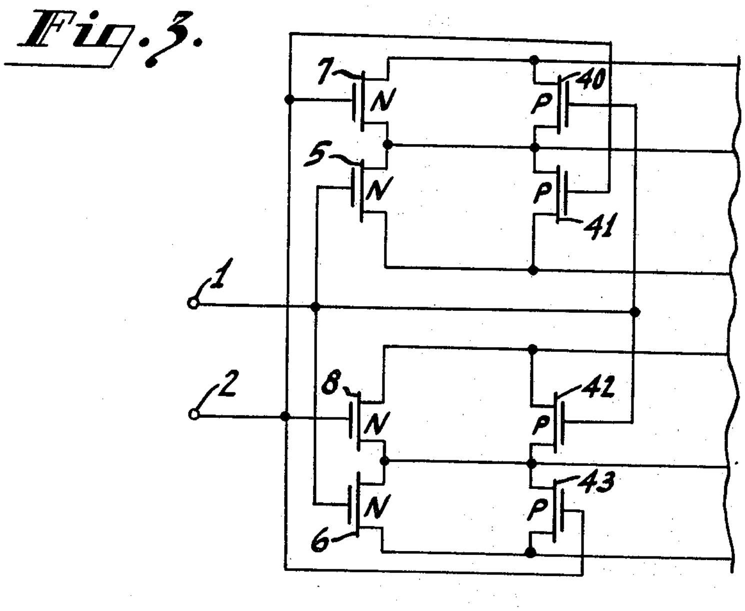
FIGURE 3 is a partial schematic showing a modification of the circuit shown in FIGURE 1.

In FIGURE 3, there is found a modification of a portion of the circuit shown in FIGURE 1. The modification comprises the addition of opposite conductivity transmission gate transistors 40, 41, 42 and 43 in parallel with gates 7, 5, 8 and 6, respectively. Suitable polarities of the input signals are applied to the gate electrodes of these additional gate transistors. Such a modified circuit has a higher circuit speed and exhibits a freedom from any restriction of the threshold voltages of the N and P-type transistors with respect to allowable level changes of the input signals.

Figure 5:
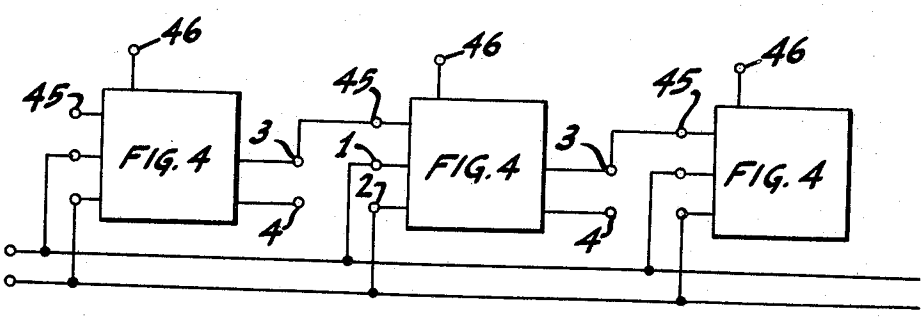
FIGURE 5 is a block diagram of a shift register using the circuit of FIGURE 4.
Figure 4:
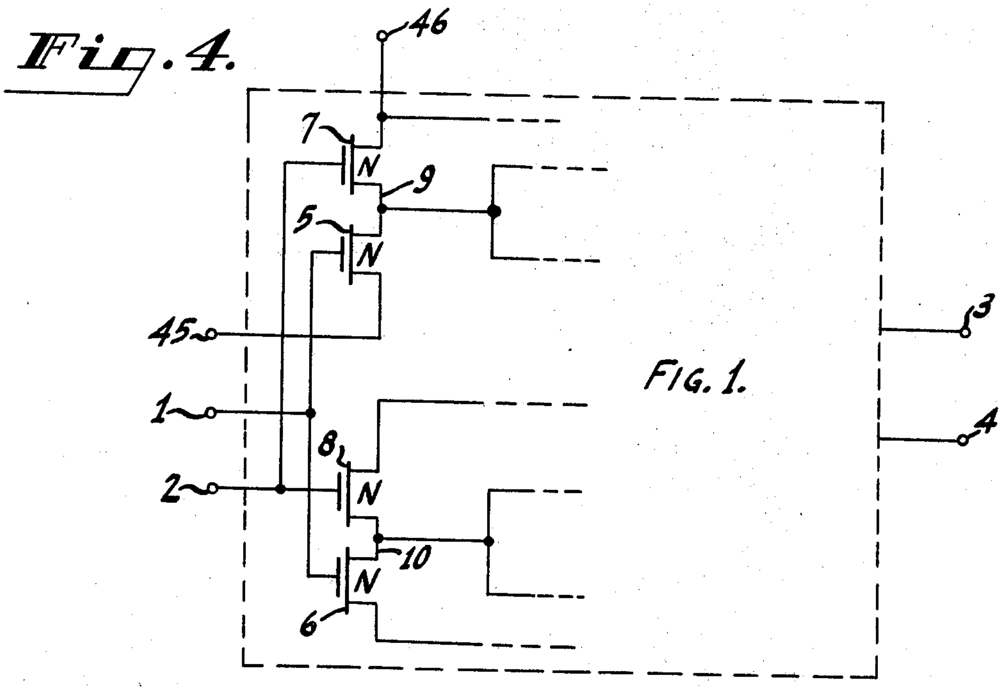
FIGURE 4 is a partial schematic of a modification of the circuit shown in FIGURE 1.

In FIGURE 4, there is shown a further modification of the circuit shown in FIGURE 1, wherein the line 26 is disconnected from the gate transistor 5. This free terminal of gate 5 is, then, connected to a third input terminal 45. A third output terminal 46 is connected to the electrode of the gate transistor 7 which is connected to the interconnection 16 of the inverter pair 14, 15. In the form shown in FIGURE 4, the signal storage and gating circuit of the present invention may be arranged as a shift register as shown in FIGURE 5. In this configuration, the terminals 46 are arranged to provide the output signals from each stage of the shift register. The first pair of inverter stages comprising transistors 11, 12, 14 and 15 is arranged as a master register level while the second inverter pair of transistors 21, 22, 24 and 25 is arranged as a slave register level. The input terminals 1, 2 of each stage are connected to a pair of shift signal lines which control, in sequence, the transfer of binary information from the master level to the slave level of one stage and, subsequently, from the slave level of one stage to the master level of a succeeding stage from terminal 3 to terminal 45. The internal operation of the circuit of the present invention forming the shift register is similar to the described above with respect to the counter embodiment shown in FIGURE 1 except that the output signal on line 26 is applied over terminal 3 to the master level of the succeeding register stage.

Accordingly, it may be seen, that there has been provided, in accordance with the present invention, a binary signal gate and storage stage using FET's and having count, storage and reset capabilities.

What is claimed is:

1. In combination:

two circuits, each circuit comprising two inverter means and a switching means, the first inverter means of each circuit applying it output directly to the input of the second inverter means of the same circuit and the second inverter means of each circuit applying its output through its switching means to the input of the first inverter means of the same circuit;

third switching means connected between the second inverter means of the first circuit and the first inverter means of the second circuit for transferring, during one time interval, the signal present at said second inverter means of said first circuit to the first inverter means of said second circuit; and fourth switching means connected between the first inverter means of the second circuit and the first inverter means of the first circuit for transferring, during another time interval, the signal present at the first inverter means of the second circuit to the first inverter means of the first circuit.

2. The combination claimed in claim 1, further including:

means for concurrently enabling the switching means of said first circuit and said third switching means while disabling the remaining two switching means and for concurrently disabling the switching means of said first circuit and said third switching means while enabling the remaining two switching means.

3. The combination as claimed in claim 2, wherein said first, second, third and fourth switching means comprise transmission gates.

4. The combination as claimed in claim 3, wherein each said inverter means comprises two complementary field-effect transistors and wherein each transmission gate comprises a single insulated-gate field-effect transistor.

5. The combination as claimed in claim 2, wherein said enabling means includes means for applying to one pair of switching means an alternating signal of one phase and to the other pair of switching means an alternating signal of opposite phase.

6. The combination comprising:

first, second, third, and fourth inverter means, each inverter means having an input and an output, the output of said first inverter means being connected to the input of said second inverter means and the output of said third inverter means being connected to the input of said fourth inverter means;

first switch means connected between the output of said second inverter means and the input of said first inverter means;

second switch means connected between the input of said third inverter means and the output of said fourth inverter means;

third switch means connected between the output of said second inverter means and the input of said third inverter means; and fourth switch means connected between the output of said third inverter means and the input of said first inverter means.

7. The combinations as claimed in claim 6, wherein each inverter means includes two transistors, one being of one conductivity and the other being of opposite conductivity, and wherein each switch means comprises one transistor.

8. In combination:

two two-state circuits, each having a set input terminal and 1 and 0 output terminals, the 1 terminal for producing an output signal indicative of a bit and the 0 output terminal for producing an output signal indicative of the complement of said bit;

first non-inverting switch means connecting the 1 output terminal of the first circuit to the set terminal of the second circuit; and second non-inverting switch means connecting the 0 output terminal of the second circuit to the set terminal of the first circuit.

9. The combination set forth in claim 8 wherein each switch means comprises a field-effect transistor transmission gate.

References Cited

UNITED STATES PATENTS

| | | | |
|---|---|---|---|
| 3,431,433 | 3/1969 | Ball et al. | 307—247 X |
| 3,252,011 | 5/1966 | Zuk. | |
| 3,267,295 | 8/1966 | Zuk | 307—221 X |
| 3,283,169 | 11/1966 | Libaw | 307—221 X |
| 3,309,534 | 3/1967 | Yu et al. | 307—304 X |
| 3,322,974 | 5/1967 | Ahrons et al. | 307—221 X |
| 3,363,115 | 1/1968 | Stephenson et al. | 307—279 |
| 3,290,569 | 12/1966 | Weimer | 307—221 |

JOHN S. HEYMAN, Primary Examiner

R. C. WOODBRIDGE, Assistant Examiner

U.S. Cl. X.R.

307—214, 755, 288, 304; 328—43, 196, 223